United States Patent [19]

Sepponen

[11] Patent Number: 4,626,784
[45] Date of Patent: Dec. 2, 1986

[54] NMR IMAGING DEVICE

[75] Inventor: Raimo Sepponen, Helsinki, Finland

[73] Assignee: Instrumentarium Oy, Finland

[21] Appl. No.: 801,492

[22] Filed: Nov. 22, 1985

Related U.S. Application Data

[63] Continuation of Ser. No. 539,322, Oct. 5, 1983, abandoned.

[30] Foreign Application Priority Data

Nov. 10, 1982 [FI] Finland .................................. 823444

[51] Int. Cl.$^4$ .............................................. G01V 29/3
[52] U.S. Cl. ...................................... 324/309; 324/312
[58] Field of Search ............... 378/901; 364/414, 561, 364/572, 574, 515; 324/309, 303, 304, 312, 313, 314

[56] References Cited

U.S. PATENT DOCUMENTS

| | | | |
|---|---|---|---|
| 3,164,661 | 1/1965 | Dellon | 364/561 |
| 3,789,832 | 2/1974 | Damadian | 324/309 |
| 3,983,399 | 9/1976 | Cox, Jr. | 364/414 |
| 4,015,196 | 3/1977 | Moore | 324/309 |
| 4,021,726 | 5/1977 | Garroway | 324/77 E |
| 4,045,731 | 8/1977 | Tokonou | 324/312 |
| 4,100,916 | 7/1978 | King | 364/414 |
| 4,184,110 | 1/1980 | Hinshaw | 324/0.5 |
| 4,189,775 | 2/1980 | Inouye | 378/901 |
| 4,213,184 | 7/1980 | Fasching | 364/574 |

FOREIGN PATENT DOCUMENTS 2091884  8/1982  United Kingdom ................ 324/309

Primary Examiner—Reinhard J. Eisenzopf
Assistant Examiner—G. Peterkin
Attorney, Agent, or Firm—Andrus, Sceales, Starke & Sawall

[57] ABSTRACT

The invention relates to a nuclear spin or NMR imaging assembly, comprising apparatus (1) for generating a homogeneous magnetic field in a region to be imaged of a target examined, sets of gradient coils (3) for producing one or more magnetic field gradients perpendicular to each other in said homogeneous magnetic field, a signal coil (2) surrounding at least substantially a region to be imaged for exciting said region with radio-frequency pulses and for receiving the generated NMR signals from the region to be imaged, amplifiers (5, 7) and filters (9, 10) for detected NMR signals, as well as a data processor and display equipment for imaging the collected information. According to the invention, the dimensions and location of a part to be imaged, including the region to be imaged and located inside said signal coil (2), are adapted to be determined in the direction of at least one gradient field, and the frequency band width of said filters (9, 10) is adapted to be controlled on the basis of said dimension and location information determined from a target to be imaged to an optimum value regarding the signal/noise ratio.

20 Claims, 11 Drawing Figures

NMR IMAGING DEVICE

This is a continuation of application Ser. No. 539,322, filed 10/5/83, now abandoned.

The present invention relates to a nuclear spin or NMR imaging assembly (NMR=Nuclear Magnetic Resonance).

BACKGROUND OF THE INVENTION

Nuclear spin imaging is a new non-destructive investigation method, one of the most important fields of application thereof being medical diagnostics. The principle of nuclear spin imaging was presented by P. Lauterbur in 1973. (Lauterbur: Nature vol. 242, Mar. 16, 1973, p. 190 ... 191). Prior to this, the operating principle of a kind of NMR phenomenon-based investigation apparatus was proposed by R. Damadian. (Damadian: U.S. Pat. No. 3,789,832). A plurality of nuclear spin imaging methods have been developed and described e.g. in references Ernst: U.S. Pat. No. 4,070,611, Garroway et al: U.S. Pat. No. 4,021,726 and Moore et al: U.S. Pat. No. 4,015,196.

Nuclear spin imaging, as well as other NMR investigation methods, are based on the fact that nuclei of some elements have a magnetic moment. Such elements include e.g. hydrogen, fluorine, carbon and phosphorus with certain isotopes thereof having a nuclear magnetic moment. Let us study e.g. the nucleus of a hydrogen atom, i.e. the proton, which is a positively-charged primary particle. Proton rotates around its own axis, i.e. it has a certain spin. The rotation creates the magnetic moment of a proton and also the flywheel moment parallel to the axis of rotation.

If a number of hydrogen atoms are placed in an external magnetic field $B_o$, most of the magnetic moments of said nuclei settle parallel to the external field $B_o$ and thus there is developed in the bunch of hydrogen atoms a net magnetization $M_n$, which is directly proportional to said external magnetic field $B_o$. However, the temperature of the subject bunch of atoms has an effect on how large is the majority creating the net magnetization as compared to the entire bunch of nuclei. When the temperature of the object is e.g. that of a human body, the quantitative difference between the majority and minority in a bunch of nuclei is just 1 millionth of the total number of nuclei. If temperature of the object could be lowered, net magnetization would increase inversely proportionally to the absolute temperature of said object.

In pulse NMR investigations, the resulting net magnetization $M_n$ is deflected with a strong radio-frequency magnetic pulse 90° from the direction of said external magnetic field $B_o$. As a result of the interaction between a flywheel moment as well as a magnetic moment, created by spring of the nuclei, and an external field, the resulting net magnetization is set in precession. The angular speed of precessive magnetic moment is directly proportional to the external magnetic field according to formula 1

$$W_o = \gamma B_o \quad (1)$$

wherein
 $\gamma$ is gyromagnetic ratio
 $B_o$ is strength of external magnetic field
 $W_o$ is so-called Larmor frequency If outside an object or a target is placed an induction coil and a capacitor for providing a resonance circuit, the magnetization in precession will induce a signal voltage in the terminals of said resonance circuit. The amplitude of signal voltage $V_s$ is directly proportional to the Q-factor or quality factor of a resonance circuit.

A more important quantity than signal voltage is the signal/noise ratio SNR. Nuclear spin imaging like all other NMR investigations depend on the obtainable signal/noise ratio. If the electric losses of a target to be examined are ignored, the resulting signal/noise ratio will be:

$$SNR = kNAf(QW^3_o/LB)^{\frac{1}{2}} \quad (2)$$

wherein
 k is a coefficient independent of field
 N is speed of rotation of detection coil
 A is cross-sectional area of the coil
 f filling ratio
 Q is quality factor of the coil
 $W_o$ is Larmor frequency
 L is inductance of the coil
 B is the bandwidth employed As set forth in equation 2, the signal/noise ratio achieved in NMR imaging is inversely proportional to the square root of a bandwidth. In nuclear spin imaging a target is covered by a magnetic field gradient during signal collection. If the order of a gradient is g [T/m] and the projection of a target in the direction of gradient is 1[m] in length, the frequency bandwidth BW of an NMR signal inducing a target in the signal coil is $$BW = (\gamma/2\pi) \cdot g \cdot 1 \quad (3)$$

Typically 1=0.2 m if the target to be imaged is the head of a human being and 1=0.5 m if the target is the thorax region of a human body. The gradients used are generally in the order of g=1 mT/m. Thus, the bandwidth of a signal obtained from a head size target is BW≈8 kHz and from the thorax region BW≈20 kHz. In normal hospital conditions, the same apparatus is required to successively take images of targets of varying sizes: body imaging being performed immediately after head imaging. If the strength of gradients used in both imagings is constant, the bandwidth of a signal in body imaging will be approximately two-fold and the necessary signal catch band will also be two-fold. Hence, when proceeding to head imaging, it is preferable to reduce the bandwidth of signal catch or collection for the improvement of signal/noise ratio.

According to the prior art, it is conventional to employ different frequency bandwidths with the assembly tuned for head imagings or body imagings. The bandwidths applied in both imagings must thus be dimensioned in a manner that all relevant targets to be imaged can be imaged. Thus, the bandwidth used in most cases is too large and therefore the signal/noise ratio will be lower than what it could be at its optimum.

SUMMARY OF THE INVENTION

An object of the invention is to provide a nuclear spin imaging device whose signal/noise ratio can be optimized regardless of a target to be imaged.

This object of the invention is achieved by means of an arrangement that is employed to determine the diameter and position of a target relative to gradient fields and the bandwidth applied in signal catch will be altered on the basis thereof.

DESCRIPTION OF THE DRAWINGS

The invention will now be described in more detail with reference made to the accompanying drawing, in which.

DESCRIPTION OF THE ILLUSTRATED EMBODIMENT

Figure 1:
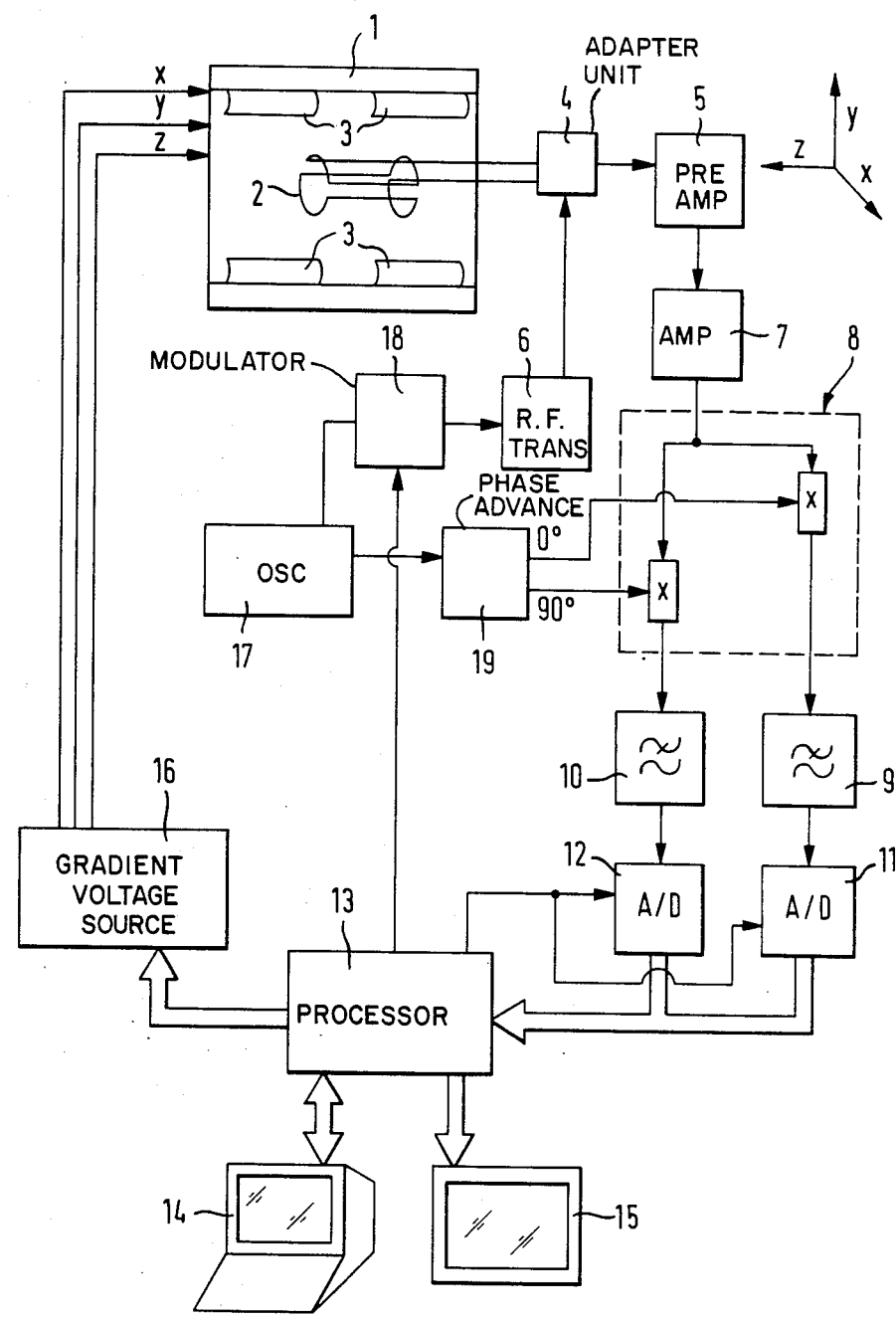
FIG. 1 shows a general block diagram of a nuclear spin imaging assembly of the prior art.

As shown in FIG. 1, the prior art nuclear spin imaging assembly comprises a magnet 1 for generating a homogeneous magnetic field in the imaging region surrounded by a signal coil 2 acting as a transmitter of radio-frequency signals and as a receiver of resulting NMR signals, sets of gradient coils 3 for creating x-, y- and z-directed magnetic field gradients as well as an adapter unit 4 for adapting the signal coil to a preamplifier 5 and radio-frequency transmitter 6. The preamplifier is connected to an amplifier 7 for amplifying a signal sufficiently for a quadrature detector 8. A detected signal is passed to low pass filters 9 and 10 and the filtering result is digitized in digitizers 11 and 12. The collected signal information is processed in a processor 13 to which the operator supplies imaging parameters by means of a terminal 14. The imaging result is shown on a video display 15. The processor also controls a gradient current source 16 of the assembly for feeding to the set of gradient coils 3 the currents required for generating the gradient fields. The assembly further comprises a basic frequency issuing, stable oscillator 17, a modulator 18 and a phase advancer 19.

Figure 2:
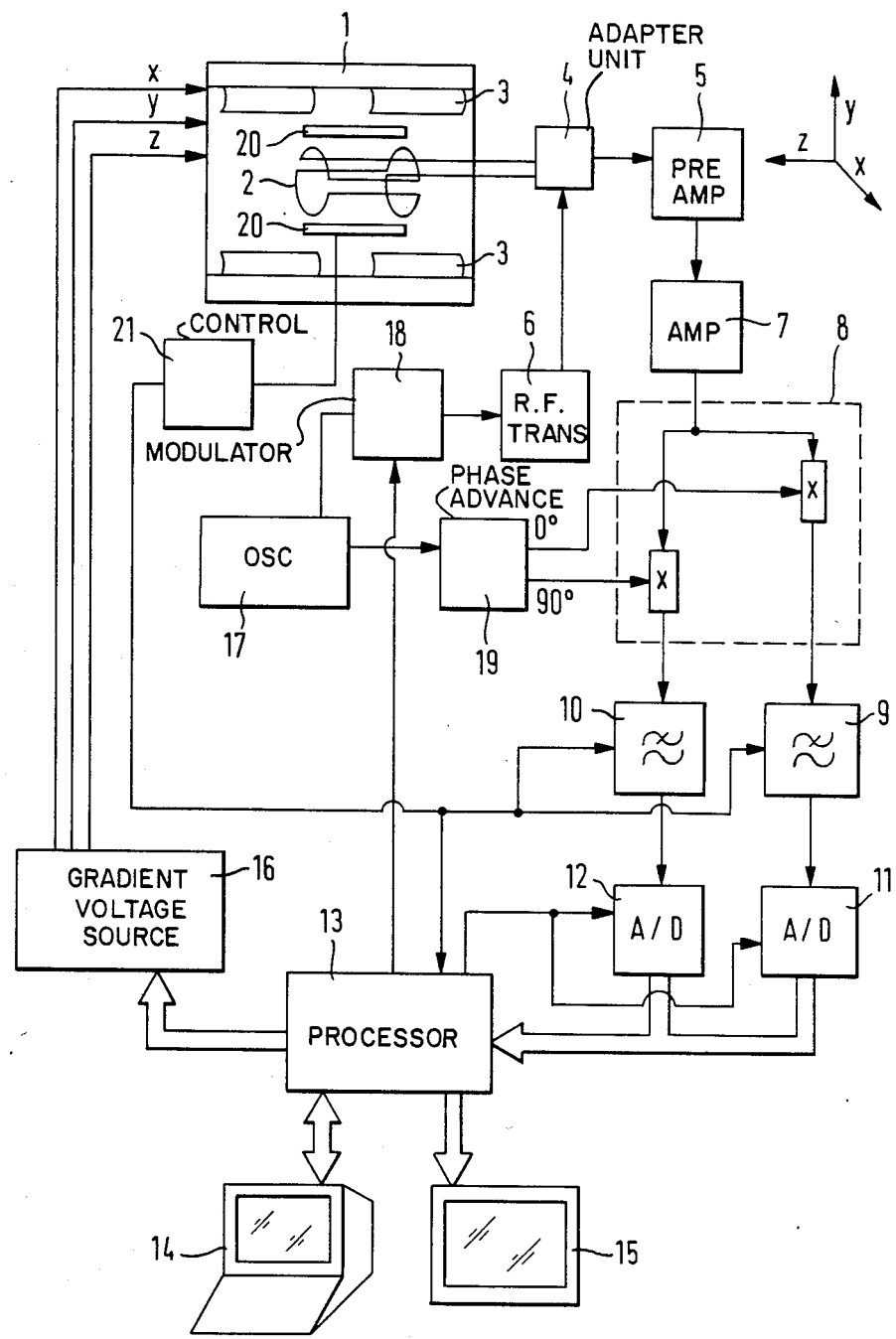
FIG. 2 shows a block diagram for a nuclear spin imaging assembly of the invention.

FIG. 2 shows a block diagram for a nuclear spin imaging assembly of the invention, said diagram including, in addition to the block diagram components of the assembly shown in FIG. 1, sensors 20 for determination of target dimensions and position in the imaging space as well as control 21 for processing the target dimension and position information for the control of low pass filters 9 and 10.

Figure 3A:
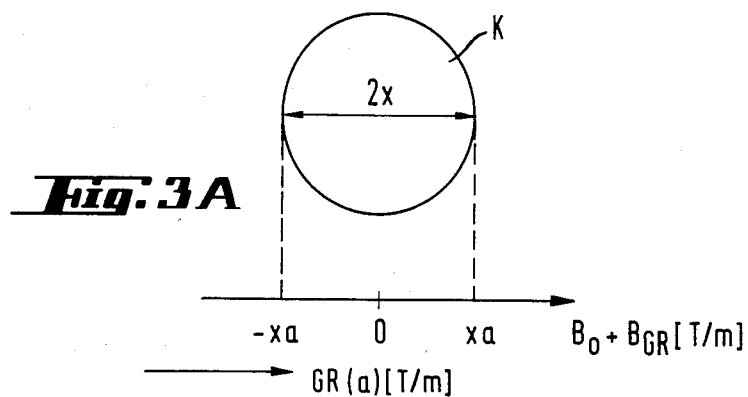
FIGS. 3a and 3b depict operation of an assembly of the invention in so-called Fourier imaging methods.
Figure 3B:
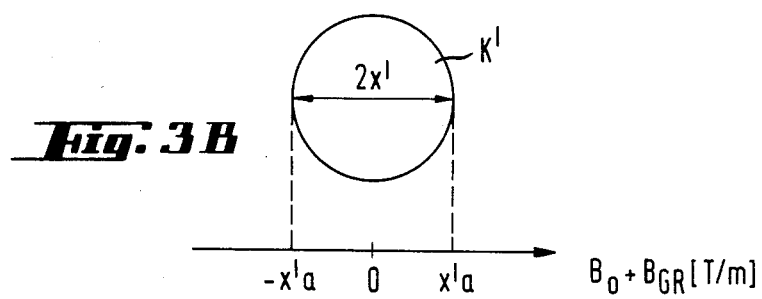

In FIG. 3A, a cylindrically-shaped target K is positioned in a gradient field GR, whose strength is a Telsa/m. In FIG. 3B, a smaller target K' is in turn positioned in a gradient field GR.

In some nuclear spin imaging methods, a target to be imaged is excited by applying an effective excitation pulse. Then, an excited nuclear system is encoded with a phase encoding gradient in a certain direction and an encoded nuclear spin signal is read under the influence of a read-out gradient. The frequency spectrum of a signal observed by the action of read-out gradients depends on the dimensions of a target. As apparent on the basis of FIGS. 3A and 3B, the frequency band of a signal to be induced from a target placed in the gradient field is according to equation 3

$$(\gamma/2\pi)\cdot 2x\cdot a [Hz]$$

or $$(\gamma/\pi)ax [Hz]$$

in the case of FIG. 3A and corresponding $\gamma/\pi ax'$ in the case of FIG. 3B. Thus, the bandwidth required for imaging the target of FIG. 3B is smaller than that required for imaging the target of FIG. 3A. According to the invention, the target diameter and position in a gradient field is now determined by sensor 20 and, on the basis of the result obtained, the bandwidth of low pass filters 9 and 10 is adjusted by using control 21. Thus, in the case of FIG. 3B, there is achieved an improvement in the signal/noise ratio of the order of $\sqrt{x/x'}$. If for example, $x=2x'$, the signal/noise ratio improvement achievable by the invention is approximately 1.4-fold which in the imaging of an entire body corresponds to increasing the strength of a magnetic field by 1.4-fold or to doubling the power consumed by a magnet. In normal conditions, a magnet suitable for whole body imagings consumes circa 50 kW, which means that the increase of output would incur considerable additional costs.

In projection-reconstruction methods, projections are formed of a target by exciting the target area and by reading a resulting NMR signal, with a gradient field extending in certain direction being coupled on. The catch or collection cycle of an excitation signal is repeated several times by changing each time the direction of a read-out gradient. The collected signals are subjected to spectrum analysis and the resulting projections are used to establish an image of the internal structure of a target by applying prior known reconstruction methods.

Figure 4:
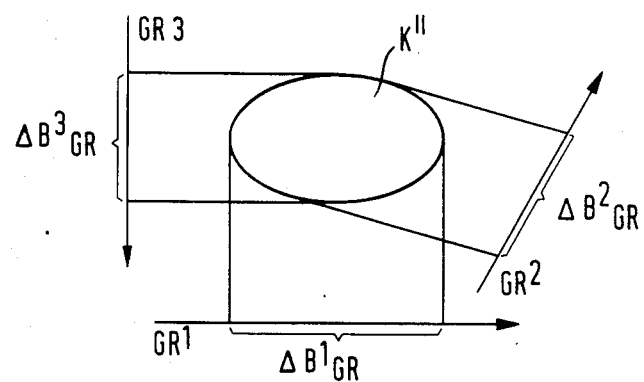
FIG. 4 shows operation of an assembly of the invention in so-called projection-reconstruction methods.

The working principle of the invention in a projection-reconstruction method is illustrated in FIG. 4. A target to be imaged is not in practice cylindrically symmetrical and hence, in signal collection, it is preferable to employ a bandwidth that corresponds to the dimension of the projection of a target relative to the direction of a read-out gradient. Thus, in the case of FIG. 4 for example, in which a target K'' shaped like a human body is placed in a variable gradient field, the alterations in a magnetic field caused thereby being $\Delta B^1_{GR}$, $\Delta B^2_{GR}$ and $\Delta B^3_{GR}$ in the directions marked in the figure, the bandwidth must be at its largest with a read-out gradient $GR^1$ coupled or $(\gamma/2\pi)\cdot\Delta B^1_{GR}$, wherein $\Delta B^1_{GR}$ is thus the change in magnetic field caused by gradient GR over a target. Correspondingly, in the $GR^2$ case, the bandwidth is $(\gamma/2\pi)\cdot\Delta B^2_{GR}$ and in the $GR^3$ case it is $(\gamma/2\pi)\cdot\Delta B^3_{GR}$.

According to FIG. 4, it is true that $(\gamma/2\pi)\cdot\Delta B^1_{GR} > (\gamma/2\pi)\cdot\Delta B^2_{GR} > (\gamma/2\pi)\cdot\Delta B^3_{GR}$.

According to the invention, sensors 20 determine the dimension of the projection of a target relative to the gradient direction and said control 21 controls filters 9 and 10 in a manner that the bandwidth thereof is optimized.

Figure 5:
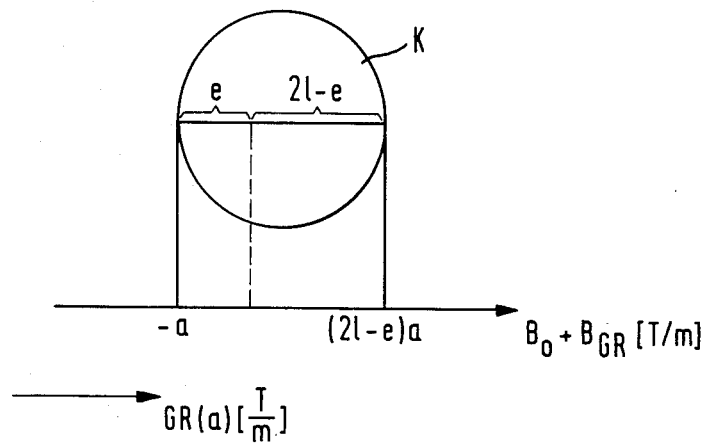
FIG. 5 is a general representation of the determination of a target position in a gradient field, FIGS. 6A, B, C, and D shows various principles of effecting the determination of a target position and dimensions.

FIG. 5 illustrates a more general case of positioning of a target asymmetrically in a gradient field. If then an NMR signal is detected in a phase detector 8 by employing as a reference frequency a resonance frequency corresponding to a magnetic field generated by magnet 1, the bandwidth of filters must be a frequency corresponding to the dimension of a target largest relative to the gradient field, i.e. in the case of FIG. 5 frequency $(\gamma/2\pi)(2l-e)a$ Hz.

According to the invention, sensors 20 determine the dimension of the projection of a target relative to the gradient direction and the output of sensors 20 control filters 9 and 10 in a manner that the bandwidth corresponds to the frequency spectrum of the NMR signal which is induced by the subject when the gradient field is switched on.

In summary, the dimension of the object in the direction of the readout gradient is measured and the bandwidth of filters 9 and 10 is adjusted according to the spectral bandwidth of the induction signal. There are many known alternatives for the realizations of the sensors 20, control 21 and filters 9 and 10.

Figure 6A:
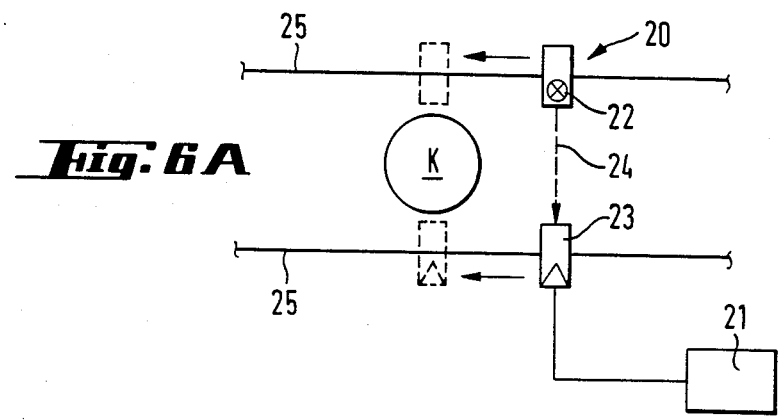
Figure 6B:
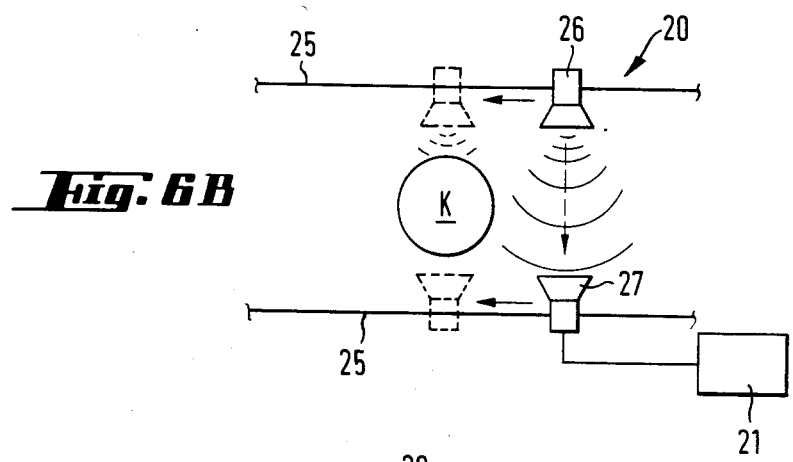
Figure 6C:
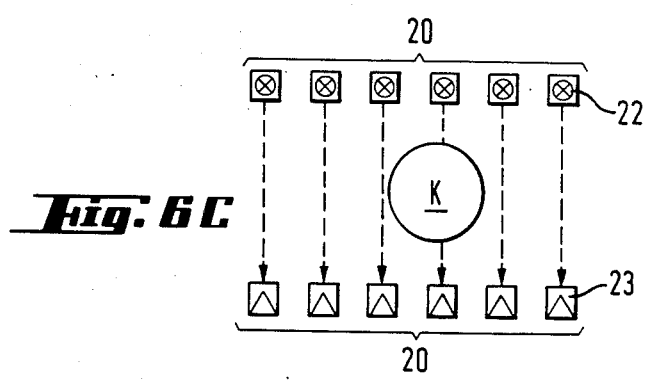

FIGS. 6A–6C show different ways of determining automatically the dimensions and position of a target. In FIG. 6A, sensors 20 include a source of light 22 which transmits a well-collimated beam of light to a photoelectric cell 23. The source of light and photoelectric cell are made displaceable along slide bars 25 for finding out the position of a target relative to the gradient field. Correspondingly, in FIG. 6B, sensors 20 consist of an ultrasonic radar 26, 27. FIG. 6C, in turn, illustrates determination of the size and position of a target K in a gradient field by using a source of light and a photoelectric cell. In each above-mentioned case, the scanning direction of sensors 20 or the alignment of an array of sensors 20 must be effected so as to comply with the direction of a magnetic field gradient. Thus, when employing a projection imaging method, the array of sensors must always be capable of being aligned according to the direction of any given gradient. However, it is also possible only to determine the dimension and position of a target in e.g. just two directions perpendicular to each other and to utilize the result thus obtained to control the bandwidth of filters 9 and 10.

One preferred embodiment is to use a nuclear spin imaging assembly for determination of a necessary bandwidth: a target is excited with a radio-frequency electromagnetic pulse and, with a read-out gradient switched on, the inducing signal is analyzed. Processor 13 analyzes the spectrum of an induced signal and sets the bandwidth of filters 9 and 10 to its optimum. For improved accuracy it is possible to repeat the excitation and detection sequence as many times over as necessary. In a projection method it is possible to first form a rough image of a target by employing e.g. 4 . . . 32 projections and to determine a required bandwidth.

Figure 6D:
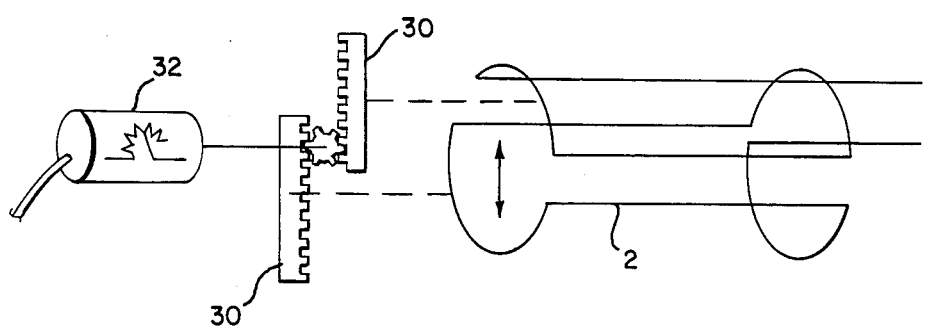

The necessary bandwidth adjustment can also be effected by controlling the bandwidth of filters 9 and 10 by a signal that corresponds to the diameter of a signal coil 2: the diameter of a signal coil can be changed according to the size of a target, if the coil is constructed as set forth in U.S. Pat. No. 4,587,493. Thus, as shown in FIG. 6D, the means 30 involved in changing the diameter of a coil 2 can be accompanied by means 32 for generating a signal corresponding to the diameter of a coil 2 and this signal can be used to change the bandwidth of filters 9 and 10.

It is known that a necessary sampling frequency for reconstruction of a signal is twice as high as the highest frequency countained in the signal. According to the invention, it is for example possible to use the information obtained as described above about the bandwidth of a signal for the determination of the sampling frequency of A/D digitizers 11 and 12.

Figure 7:
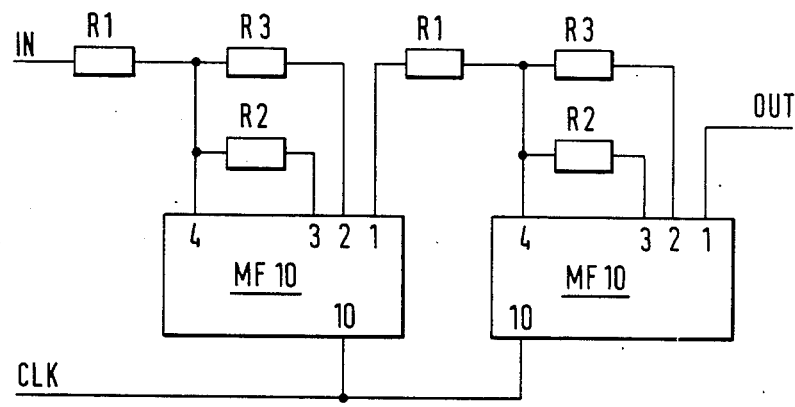
FIG. 7 shows one example of a low pass filter coupling adapted for use in the present invention in the invention.

Filters 9 and 10 can be designed e.g. by employing a frequency-controlled active filter circuit MF10, manufactured by National Semiconductor (USA). FIG. 7 shows a fourth degree low pass filter suitable for the purpose of the invention. The cut-off frequency $f_r$ of low pass filtering can be determined by means of frequency $f_{CLK}$ of a control signal CLK as follows $$f_r = f_{CLK}/50$$

$f_{CLK}$ is found out on the basis of the information on the position and dimension of a target obtained from sensor 20. Control 21 is preferably designed as a microprocessor which processes the information obtained and forms a signal CLK on the basis thereof.

The invention is by no means limited to the above embodiments but a variety of modifications thereof can be made within the scope of the annexed claims.

I claim:

1. A device for nuclear magnetic resonance imaging of an object and having an improved signal/noise ratio in the NMR signal, said device comprising:
   means (1) for generating a generally homogeneous magnetic field in the imaging region;
   sets (3) of gradient coils for producing magnetic field gradients in the magnetic field,
   signal coil means (2) at least substantially surrounding the imaging region for exciting the object and receiving NMR signals from the object;
   amplifier means (5, 7) and filter means (9, 10) coupled to said signal coil means for detecting NMR signals from the object, said filter means having an alterable bandwidth;
   sensor means (20) for determining at least one of the dimension and position of the portion of the object to be imaged in the direction of the gradient field used in the imaging; and
   control means (21) coupled to said sensor means for altering the bandwidth of said filter means (9, 10) to a value determined, at least in part, by the position and dimension information obtained from said sensor means (20).

2. The device according to claim 1 wherein said control means is further defined as altering the bandwidth of said filter means to a value determined by the position and dimension information obtained from said sensor means and from the strength of the gradient field.

3. The device according to claim 1 wherein said filter means comprises low pass filter means having means for controlling the cut-off frequency responsive to a signal from said control means.

4. The device according to claim 1 wherein said sensor means (20) comprises one or more pairs of light sources (22) and photoelectric cells (23) arranged in said device to determine at least one of the position and dimension of the portion of the object to be imaged.

5. The device according to claim 1 wherein said sensor means (20) comprises an ultrasonic transmitter-receiver means (26, 27) arranged in said device to determine at least one of the position and dimension of the portion of the object to be imaged.

6. The device according to claim 1 further including means for aligning said sensor means in accordance with each given direction of a gradient field used in imaging.

7. The device according to claim 1 further containing signal digitizing circuit means (11, 12) for collecting the NMR signal filtered by said filter means, the sampling frequency of said signal digitizing circuit means being changable in accordance with the bandwidth of said filter means.

8. The device according to claim 1 wherein said control means provides a frequency output signal to said filter means and wherein said filter means comprises means, the bandwidth of which may be altered responsive to the frequency of an input signal thereto.

9. A device for nuclear magnetic resonance imaging of an object and having an improved signal/noise ratio in the NMR signal, said device comprising:
  means for generating a generally homogeneous magnetic field in the imaging region;
  sets of gradient coils for producing magnetic field gradients in the magnetic field;
  signal coil means at least substantially surrounding the imaging region for exciting the object and receiving NMR signals from the object;
  amplifier means and filter means coupled to said signal coil means for detecting NMR signals from the object, said filter means having an alterable bandwidth;
  spectrum analysis means for receiving an NMR signal prior to imaging and for frequency analyzing same for determining at least one of the dimensions and position of the portion of the object to be imaged; and
  control means coupled to said spectrum analysis means for altering the bandwidth of said filter means to a value determined, at least in part by the frequency analysis performed by said spectrum analysis means.

10. The device according to claim 9 wherein said filter means comprises low pass filter means having means for controlling the cut-off frequency responsive to a signal from said control means.

11. The device according to claim 9 further containing signal digitizing circuit means for collecting the NMR signal filtered by said filter means, the sampling frequency of said signal digitizing circuit means being changable in accordance with the bandwidth of said filter means.

12. The device according to claim 9 wherein said control means provides a frequency output signal to said filter means and wherein said filter means comprises means, the bandwidth of which may be altered responsive to the frequency of an input signal thereto.

13. A device for nuclear magnetic resonance imaging of an object and having an improved signal/noise ratio in the NMR signal, said device comprising:
  means for generating a generally homogeneous magnetic field in the imaging region;
  sets of gradient coils for producing magnetic field gradients in the magnetic field;
  signal coil means at least substantially surrounding the imaging region for exciting the object and receiving NMR signals from the object;
  amplifier means and filter means coupled to said signal coil means for detecting NMR signals from the object, said filter means having an alterable bandwidth;
  means for obtaining a preliminary NMR image of the portion of the object to be imaged and determining at least one of the dimension and the position of the portion of the object to be imaged; and
  control means coupled to said imaging means for altering the bandwidth of said filter means to a value determined, at least in part, by the position and dimension information obtained from said preliminary image.

14. The device according to claim 13 wherein said filter means comprises low pass filter means having means for controlling the cut-off frequency responsive to a signal from said control means.

15. The device according to claim 13 further containing signal digitizing circuit means for collecting the NMR signal filtered by said filter means, the sampling frequency of said signal digitizing circuit means being changable in accordance with the bandwidth of said filter means.

16. The device according to claim 13 wherein said control means provides a frequency output signal to said filter means and wherein said filter means comprises means, the bandwidth of which may be altered responsive to the frequency of an input signal thereto.

17. A device for nuclear magnetic resonance imaging of an object and having an improved signal/noise ratio in the NMR signal, said device comprising:
  means for generating a generally homogeneous magnetic field in the imaging region;
  sets of gradient coils for producing magnetic field gradients in the magnetic fiels;
  signal coil means at least substantially surrounding the imaging region for exciting the object and receiving NMR signals from the object, said signal coil means being adjustable in accordance with the dimensions and position of the object;
  amplifier means and filter means coupled to said signal coil means for detecting NMR signals from the object, said filter means having an alterable bandwidth;
  signal means responsive to the adjustment of said signal coil means for determining at least one of the dimension and the position of the portion of the object to be imaged; and
  control means coupled to said signal means for altering the bandwidth of said filter means to a value determined, at least in part, by the position and dimension information obtained from said signal means.

18. The device according to claim 17 wherein said filter means comprises low pass filter means having means for controlling the cut-off frequency responsive to a signal from said control means.

19. The device according to claim 17 further containing signal digitizing circuit means for collecting the NMR signal filtered by said filter means, the sampling frequency of said signal digitizing circuit means being changable in accordance with the bandwidth of said filter means.

20. The device according to claim 17 wherein said control means provides a frequency output signal to said filter means and wherein said filter means comprises means, the bandwidth of which may be altered responsive to the frequency of an input signal thereto.

* * * * *